United States Patent

Hush

Patent Number: 5,450,355
Date of Patent: Sep. 12, 1995

[54] MULTI-PORT MEMORY DEVICE
[75] Inventor: Glen E. Hush, Boise, Id.
[73] Assignee: Micron Semiconductor, Inc., Boise, Id.
[21] Appl. No.: 13,897
[22] Filed: Feb. 5, 1993
[51] Int. Cl.⁶ .................. G11C 7/00; G11C 11/40; G11C 8/00
[52] U.S. Cl. .................. 365/189.04; 365/230.05; 365/230.09; 365/239; 365/221
[58] Field of Search .......... 365/189.04, 230.05, 365/221, 230.05, 230.09, 239

[56] References Cited
U.S. PATENT DOCUMENTS

| | | | |
|---|---|---|---|
| 4,825,411 | 4/1989 | Hamano | 365/230.05 |
| 4,851,834 | 7/1989 | Stockebrand et al. | 340/801 |
| 4,855,959 | 8/1989 | Kobayashi | 365/230.09 |
| 4,891,794 | 1/1990 | Hush et al. | 365/189.04 |
| 5,065,369 | 11/1991 | Toda | 365/230.05 |
| 5,121,360 | 6/1992 | West et al. | 365/230.05 |
| 5,265,049 | 9/1993 | Watanabe | 365/230.05 |

FOREIGN PATENT DOCUMENTS 0189989  8/1991  Japan ................ 365/230.05

Primary Examiner—Eugene R. LaRoche
Assistant Examiner—Huan Hoang
Attorney, Agent, or Firm—William R. Bachand; Ozer M. N. Teitelbaum

[57] ABSTRACT

A multi-port memory device includes a row-column array, a random access port, a plurality of bidirectional serial access memory (SAM) ports, and a switching network. There is one SAM port for each of a plurality of sets of columns. The switching network selectively couples each SAM port with each set, each set with each other set, and each SAM port with each other SAM port. A video random access memory (VRAM) or a multi-port dynamic random access memory (DRAM) of the present invention provides increased flexibility in smaller die area.

20 Claims, 5 Drawing Sheets

MULTI-PORT MEMORY DEVICE

FIELD OF THE INVENTION

This invention relates to semiconductor memory devices and more particularly to multiple serial access ports for random access memory devices requiring substantially less space on a semiconductor wafer.

BACKGROUND OF THE INVENTION

Dual port Dynamic Random Access Memories ("DRAMs") with dual ports first became popular in the mid 1980s. Armed with an additional port to allow for serial input/output access, these devices have been labeled Video Random Access Memories ("VRAMs") because of their ability to overcome the bottleneck that existed in presenting data to and from the computer screen.

Referring to FIG. 1, an early conventional VRAM design is illustrated. Each VRAM comprises a memory array 10 having a number of memory cells, the number of cells being defined by the number of rows and number of columns in array 10. For example, a Megabit (1 Mbit) array would have 1024 rows and 1024 columns or some combination thereof. Coupled to each cell of array 10 is a random access memory port 20, as in traditional DRAM architecture. Random access memory port 20 allows for the selective access of each cell within array 10. Thus, any cell can be read or written through memory port 20.

To enable a block of stored data to be rapidly accessed, each row from array 10 is also coupled to a bidirectional serial access port 30. This serial access port 30, also referred to as a Serial Access Memory ("SAM"), has a number of lines 35 directly corresponding to the number of columns of array 10. As such, using this configuration, a one-to-one relationship exists between the number of columns and the length of SAM 30.

The dual port DRAM design is particularly convenient for video applications. This is because some address sequences, such as pixels in a raster scan, are predetermined. SAM 30 provides a means for reading a row of information from array 10 and serially outputting this data according to a particular scheme. Similarly, a row of information can be serially input to SAM 30, and subsequently written as a unit to the appropriate row of cells within array 10. As such, data may be read from the SAM at DRAM address speeds and serially output through the serial access port, and vice versa. Nonetheless, both a read and a write function of SAM 30 cannot be performed simultaneously.

In order to increase the overall speed of the dual port DRAM (VRAM) design, several architectural alternatives have been examined. One such configuration, corresponding to U.S. Pat. No. 4,891,794 is simply depicted in FIG. 2. Here, inventors Hush et al. employ a second independent bidirectional SAM, SAM-B 40, in addition to the SAM-A 30 of the original VRAM architecture. Like SAM-A 30, SAM-B 40 is independently coupled to each column of array 10, thereby enabling concurrent serial reading from and serial writing to an available SAM.

The additional SAM has particular advantages in the areas of image acquisition ("frame grabbers") and high speed network controlling and buffering. Without a second SAM, many of these designs must switch the direction of the serial port for input and output. For example, frame grabber video boards acquire images in real time and subsequently manipulate the image data, through filtering, edge detection, etc., or add computer generated information to the captured image, such as text overlay or windows. The composite image can then be output for display purposes. However, all three operations—input, output and processing—cannot be performed simultaneously in real time in a standard VRAM or DRAM. Thus, by adding the second serial access port or SAM, data can be input serially, serially output and displayed, and processed by means of the random access port, all at the same time. This is because all three ports—the random access port and both serial access ports - operate independently and asynchronously of each other, except during an internal transfer of data.

While the design of Hush et al. in U.S. Pat. No. 4,891,794 reaps the benefits of a three port random access memory, it also has several limitations. First, the need to couple each column of array 10 to each line of both SAM-A 30 and SAM-B 40 causes the layout of this circuit to be considerably larger than a conventional dual port DRAM architecture. Lines 45 must cross over or under SAM-A for proper coupling with SAM-B. In order to avoid this type of arrangement, circuit designers have repositioned the SAMs locating one on each side of the memory array as well as divided the array into two equivalent halves.

Moreover, the triple port approach of Hush et al. in U.S. Pat. No. 4,891,794 is limited in terms its ability to manipulate data serially. The design, though an improvement over the dual port DRAM approach, can serially read and serially write information only from two ports. There is a demand for a greater number of serial ports without substantially increased die size space. Further, an enhanced overall speed is needed with the onset of more advanced electronics. These demands are evident in communications applications of VRAM devices.

SUMMARY OF THE INVENTION

The primary object of the present invention is to eliminate the aforementioned drawbacks of the prior art.

Another object of the present invention is to provide a multi-port DRAM requiring less space on a semiconductor wafer.

A further object of the present invention is to provide a multi-port DRAM having improved performance characteristics.

Yet another object of the present invention is to provide a multi-port DRAM architecture having greater flexibility.

In order to achieve these objects, as well as others which will become apparent hereafter, a multi-port memory device of the present invention comprises a memory array having a plurality of cells for storing data, the array being defined by a number of rows and a number of columns. The number of columns of the array is further defined by a plurality of sets, where there is at least a first set and a second set. Further, a random access memory port for accessing data is coupled to the array, such that the random access memory can selectively access each cell of the array. The device further comprises a plurality of bidirectional serial access memory ("SAM") ports for serially accessing data. The number of SAM ports being equal to the number of sets. Moreover, a switching network is incorporated for selectively coupling each SAM port with each set, each set with each other set, and each SAM port with each other SAM port. The switching network is realized by means of a plurality of transfer and switching gates. In the preferred embodiment of the present invention, the device comprises one decoder for selecting an order for data to be accessed through each SAM port. Further, each SAM port comprises a latch for storing accessed data and a shift register for providing the order of the data to be accessed through the latch. Each shift register is coupled to its respective latch, as well as the decoder. Alternatively, each SAM port comprises both a latch for storing serially accessed data and a pointer for selecting the order in which the data is to be accessed through the latch. In a further alternative, each SAM port solely comprises a shift register for accessing the data.

Other objects and advantages will become apparent to those skilled in the art from the following detailed description read in conjunction with the appended claims and the drawings attached hereto.

BRIEF DESCRIPTION OF THE DRAWINGS

The present invention will be better understood from reading the following description of non-limitative embodiments, with reference to the attached drawings, wherein below.

It should be emphasized that the drawings of the instant application are not to scale but are merely schematic representations and are not intended to portray the specific parameters or the structural details of the invention, which can be determined by one of skill in the art by examination of the information herein.

DETAILED DESCRIPTION OF THE INVENTION

Figure 1:
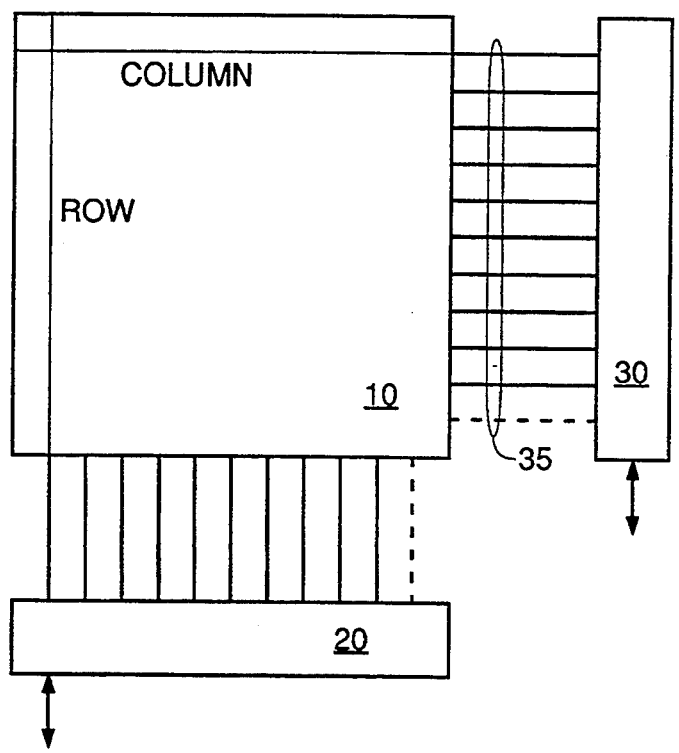
FIG. 1 is an illustration of the traditional architecture associated with a dual port dynamic random access memory.
Figure 2:
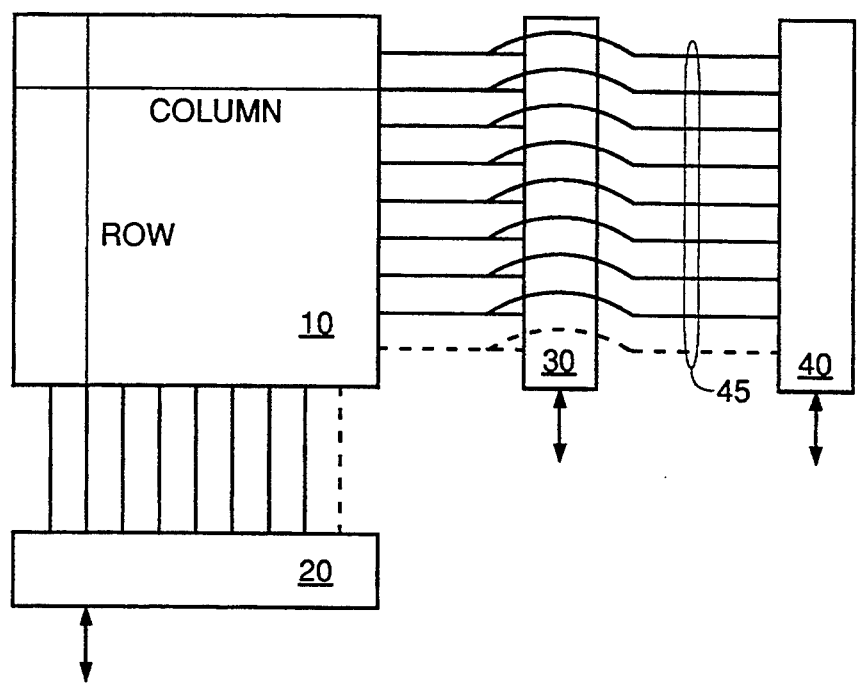
FIG. 2 is an illustration of the traditional architecture associated with a triple port dynamic random access memory.
Figure 3:
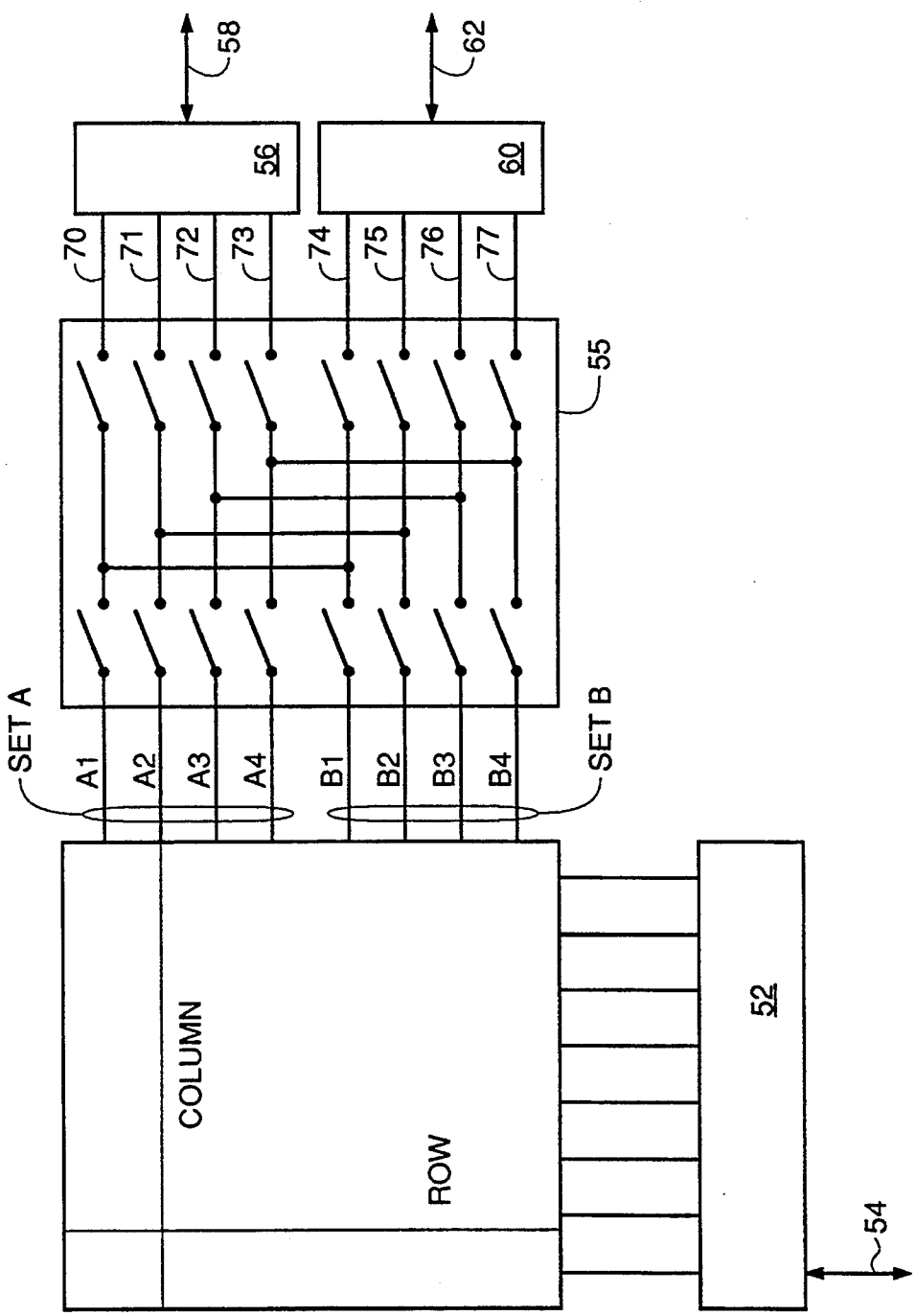
FIG. 3 is an illustration of a first embodiment of the present invention.

Referring to FIG. 3, an array of memory cells 50 is illustrated. The array 50 is defined by a predetermined number of rows and a predetermined number of columns. In FIG. 3, the array depicted comprises 8 rows and 8 columns, and thus 64 memory cells. It should be obvious to one of ordinary skill in the art that the present invention need not be limited to these number of rows and columns in order to operate properly.

Coupled to each row and each column of array 50 is random access memory ("RAM") port 52. RAM port 52, by means of an addressing scheme, control logic and digital circuitry (not shown), accesses any cell of the array 50. The cell accessed can be read from or written to, depending on the mode of operation of the RAM port 52. The read/write interface of RAM port 52 includes RAM port input/output ("I/O") signal 54. Specifications for signals associated with the operation of RAM port 52 should be obvious to one of ordinary skill in the art, particularly in light of U.S. Pat. No. 4,891,794 and as such, are not provided herewith.

In order to serially access array 50, a number of bidirectional serial access memories ("SAM") are employed. In traditional architecture, each row is coupled to one or more SAMs. However, in the present invention, the number of columns of array 50 is divided into sets. The number of sets thereby established directly relates to the number of SAMs employed.

In FIG. 3, the 8 columns in array 50 are divided into two sets: set A and set B. Set A comprises columns 0 through 3 (A0–A3), while set B comprises columns 4 though 7 (B0–B3). Directly corresponding to the division of columns 0 through 7 into set A and set B, are a first and second SAM:—SAM-A 56 and SAM-B 60. The lengths of SAM-A 56 and SAM-B 60, in the preferred embodiment of the present invention, are equal to the number of columns in set A and the number of columns in set B, respectively, in the preferred embodiment of the present invention. In light of the lengths of SAM-A 56 and SAM-B 60, the number of columns in set A and set B are also equal.

To fully take advantage of the performance of a multi-port architecture, both the columns in set A are coupled with SAM-A 56, and the columns in set B are coupled with SAM-B 60 by means of a switching network 55. Moreover, both the columns of set A are coupled with SAM-B 60, and the columns of set B are coupled with SAM-A 56 by means of switching network 55. Using this arrangement, either set of columns can be accessed by an available SAM.

Moreover, each SAM is selectively coupled to each other SAM by means of switching network 55. Thus, the data in SAM-A is directly transferable to SAM-B or vice versa. For example, when enabled, lines 70–73 are coupled to their respective counterparts (lines 74–77) in SAM-B—line 70 with line 74, line 71 with line 75, line 72 with line 76, and line 73 with line 77.

Furthermore, each set of columns of a row are selectively coupled to each other set of columns by means of switching network 55. Thus, the data in set A of a particular row is directly transferable to set B of that same row or vice versa. For example, when enabled, columns A0–A3 are coupled to their respective counterparts, columns B0–B3: column A0 with B0, column A1 with B1, column A2 with B2, and column A3 with B3.

The foregoing flexibility of the present architecture is provided in part by switching network 55. Switching network 55 provides a means for transferring data between SAMs, between sets, between set A and SAM-A, between set B and SAM-B, between set A and SAM-B, and set B to SAM-A. To perform all these functions, switching network 55 includes transfer and switching gates (not shown).

As SAM-A 56 and SAM-B 60 both comprise a serial input/output ("I/O") interface, 58 and 62, respectively, for reading and writing, the present architecture provides a multi-port architecture. Reading and writing signal specifications of SAM ports 56 and 60 should be obvious to one of ordinary skill in the art, particularly in light of U.S. Pat. No. 4,891,794 and as such, are not provided herewith. However, unlike the traditional multi-port approach, the present invention requires much less space, as the length of each SAM directly correlates to the number of columns in each set. These savings, in comparison with the traditional multi-port architecture, enable the overall die size to be reduced up to 50 percent for a device comprising eight (8) serial ports.

Figure 4:
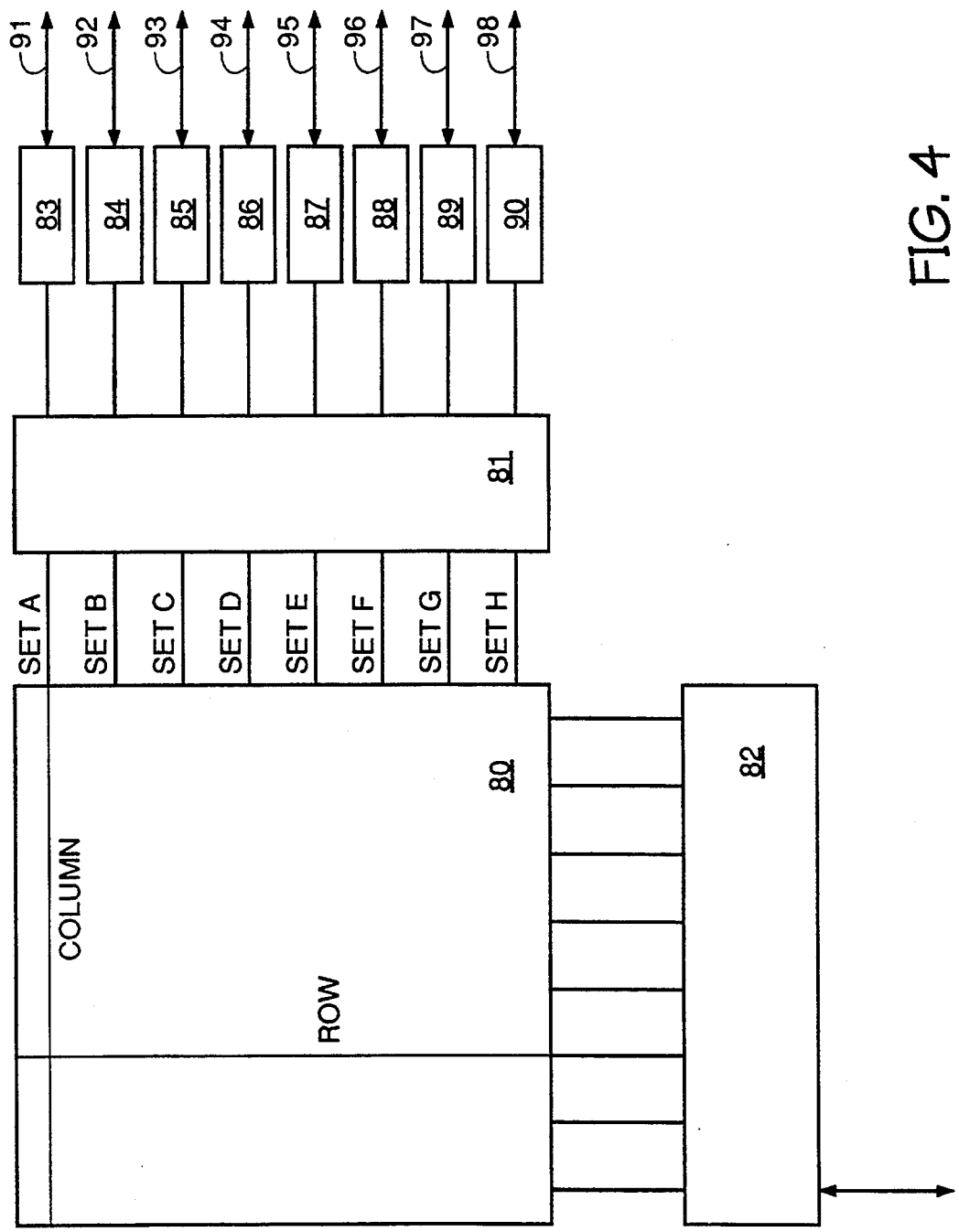
FIG. 4 is an illustration of the preferred embodiment of the present invention.

Referring to FIG. 4, an alternate multi-port architecture relying on the fundamental principles illustrated in FIG. 3 is shown. An array of memory cells 80 defined by a number of rows and a number of columns is shown. The number of columns in array 80 are divided into eight sets: sets A, B, C, D, E, F, G, and H. Coupled to each row and each column of array 80 is a RAM port 82 for accessing each cell. Further, eight independent bidirectional SAMs:—SAM-A 83, SAM-B 84, SAM-C 85, SAM-D 86, SAM-E 87, SAM-F 88, SAM-G 89, and SAM-H 90 are each coupled with each set of columns by means of switching network 81. Similar to switching network 55 in FIG. 3, switching network 81 enables any set of columns to be selectively coupled to any SAM, any SAM to be selectively coupled with any other SAM, and any set of columns to be selectively coupled with any other set of columns. Further, each SAM-:—SAM-A 83, SAM-B 84, SAM-C 85, SAM-D 86, SAM-E 87, SAM-F 88, SAM-G 89, and SAM-H 90 comprises a serial input/output ("I/O") interface 91-98, respectively, for reading and writing.

Figure 5:
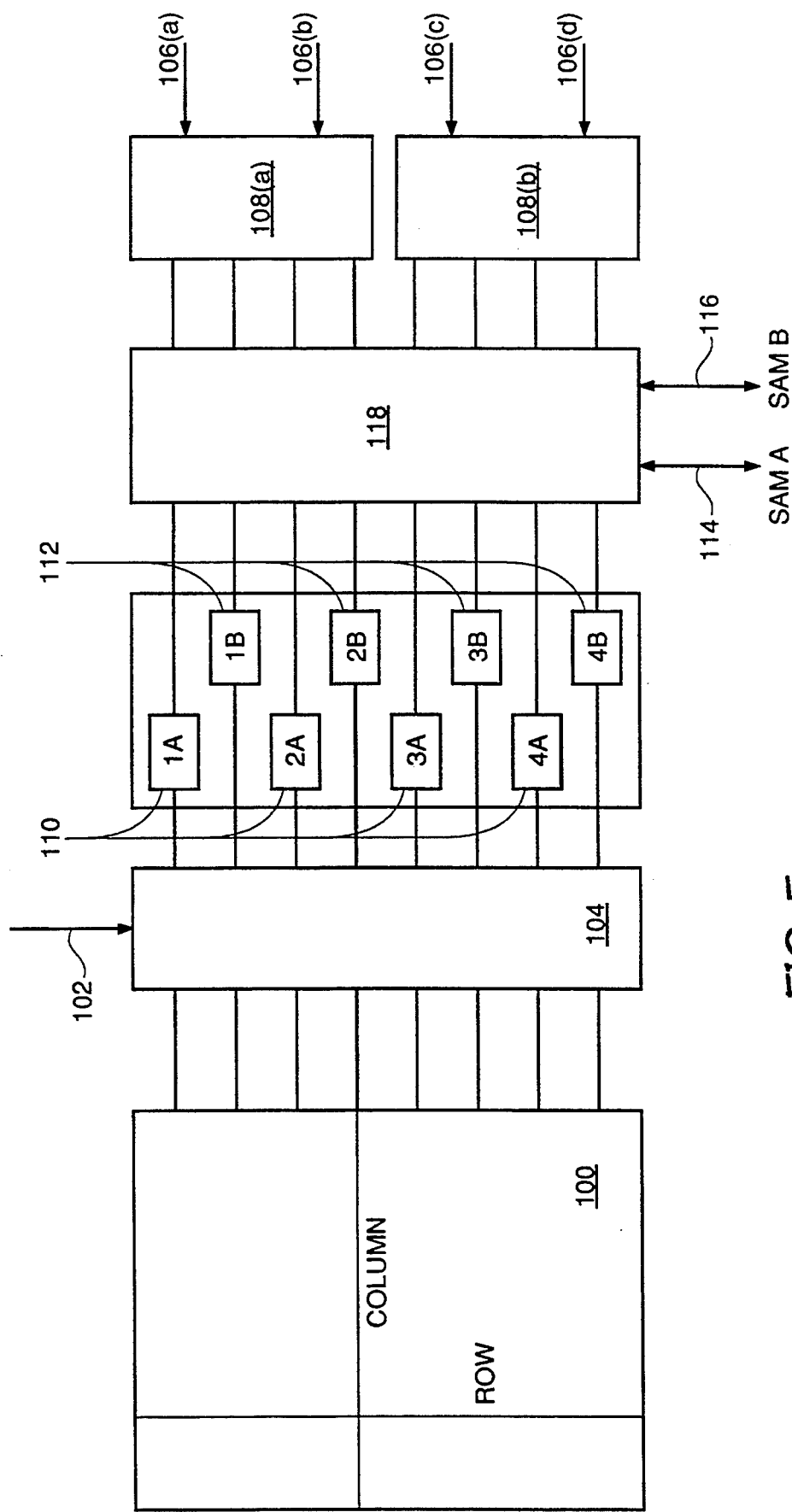
FIG. 5 is one hardware realization of the present invention.

Referring to FIG. 5, one hardware realization of the present invention is illustrated. An array of memory cells 100 defined by a number of rows and a number of columns is shown. The number of columns in array 100 are divided into set A and set B. Each set of columns is coupled to a series of latches, 110 or 112, by means of switching network 104. Switching network 104 enables each set of columns to be selectively coupled with each series of latches, each series of latches to be selectively coupled with the other series of latches, and any set of columns to be selectively coupled with any other set of columns. A series of control signals 102 facilitate this selective coupling. Furthermore, each series of latches, 110 and 112, are coupled to a pointer/decoder, 108(a) and 108(b), respectively, by means of switching network 118. Switching network 118 provides serial access I/O lines 114 and 116 for each set of columns. A series of control signals, 106(a) and 106(b) with respect to pointer/decoder 108(a), and 106(c) and 106(d) with respect to pointer/decoder 108(b), enables each pointer/decoder 108(a) and 108(b) to determine which data is to be read from a series of latches in one mode of operation, and in another mode of operation, the location the data is to be written.

Figure 6:
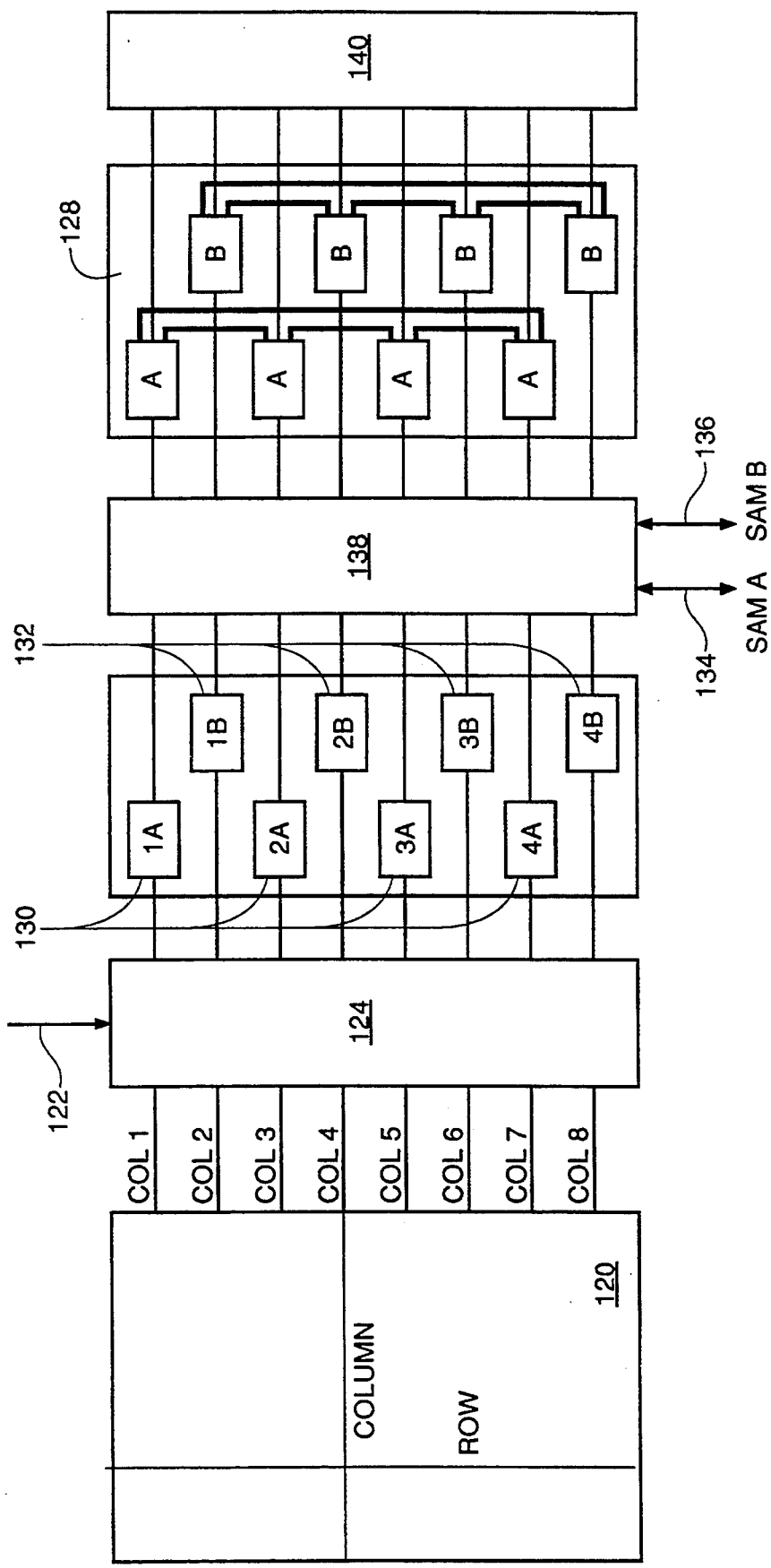
FIG. 6 is a preferred realization of the present invention.

FIG. 6 is a preferred realization of the present invention. An array of memory cells 120 defined by a number of rows and a number of columns is shown. The number of columns in array 120 is divided into set A and set B. Each set of columns is coupled to a series of latches, 130 or 132, by means of switching network 124. Switching network 124 enables each set of columns to be selectively coupled with each series of latches, each series of latches to be selectively coupled with the other series of latches, and any set of columns to be selectively coupled with any other set of columns. A series of control signals 122 facilitate this selective coupling. Furthermore, both series of latches, 130 and 132, are coupled to shift register (also known as "bucket brigade") by means of switching circuitry 138. Shift register 128 is also coupled to a decoder 140, which loads a starting access location. Having been loaded with a start location, shift register 128 points to the appropriate column of the set which is to be written or read through switching circuitry 138. Serial access I/O lines 134 and 136, by means of switching circuitry 138, are provided as a read/write interface for each set of columns.

While the realization of FIG. 6 may appear to be more complex because of the need for additional circuitry, it is preferred. This realization is preferred because the realization of FIG. 5 requires a pointer/decoder for each set of columns; for example, 8 pointer/decoders for 8 sets of columns. In contrast, the realization of FIG. 6 requires only one shift register and tap load decoder, irrespective of the number of sets of columns. It should be obvious to one of ordinary skill in the art that the present invention can also be realized solely by means of a shift register. However, utilizing such realization, the overall system performance is slowed because of the lack of a pointer identifying the data to be input/output.

While the particular invention has been described with reference to illustrative embodiments, this description is not meant to be construed in a limiting sense. It should be obvious to one of ordinary skill in the art that alternate configurations of the present architecture could be devised to promote the present invention. As such, it is understood that although the present invention has been described in a preferred embodiment, various modifications of the illustrative embodiments, as well as additional embodiments of the invention, will be apparent to persons skilled in the art upon reference to this description without departing from the spirit of the invention, as recited in the claims appended hereto. It is therefore contemplated that the appended claims will cover any such modifications or embodiments that fall within the true scope of the invention.

All of the U.S. Patents cited herein are hereby incorporated by reference as if set forth in their entirety.

What is claimed is:

1. A device for storing data comprising:
    an array of memory cells for storing data, said array defined by a number of rows and a number of columns, said number of columns defined by a plurality of sets, the number of sets being greater than 2;
    a multiplicity of first means for serially accessing data, said multiplicity defined by said plurality; and
    second means for selectively coupling each of said first means with each of said sets.

2. A device for storing data, according to claim 1, further comprising third means for randomly accessing data, said third means selectively coupled with each cell of said array.

3. A device for storing data, according to claim 2, wherein for at least one of said first means, serial accessing data is bidirectional.

4. A device for storing data, according to claim 3, wherein each of said sets comprises an equal number of columns.

5. A device for storing data, according to claim 4, wherein said multiplicity equals said plurality.

6. A device for storing data, according to claim 5, further comprising means for selectively joining each set of said plurality with each other set of said plurality.

7. A device for storing data, according to claim 6, further comprising means for selectively associating each means of said multiplicity with each other means of said multiplicity.

8. A device for storing data, according to claim 7, wherein at least one of said means for selectively coupling, means for selectively joining, and means for selectively associating comprises a plurality of transfer and switching gates.

9. A device for storing data, according to claim 7, wherein at least one means of said multiplicity of means for serially accessing data comprises dynamic memory circuitry.

10. A device for storing data, according to claim 7, wherein at least one means of said multiplicity of means for serially accessing data comprises static memory circuitry.

11. A device for storing data, according to claim 10, wherein each of said serial access means comprises a shift register for accessing data.

12. A device for storing data, according to claim 10, wherein each of said serial access means comprises a latch for storing data.

13. A device for storing data, according to claim 12, wherein each of said serial access means comprises a pointer for enabling said data to be accessed from said latch in a predetermined order.

14. A device for storing data, according to claim 12, wherein each of said serial access means comprises a shift register for providing said data to be accessed from said latch in a predetermined order.

15. A device for storing data, according to claim 14, wherein said multiplicity of means for serially accessing data comprises a pointer for selecting said predetermined order for said data to be accessed.

16. A semiconductor device for storing data comprising:
 an array of memory cells for storing data, said array defined by a number of rows and a number of columns, said number of columns defined by a plurality of sets;
 a random access port for accessing data, said random access port selectively associated with each cell of said array;
 a multiplicity of bidirectional serial access memories for accessing data; and
 a switching system for selectively coupling each bidirectional serial access memory of said multiplicity with each set of said plurality, each serial access memory of said multiplicity with each other serial access memory of said multiplicity, and each set of said plurality with each other set of said plurality.

17. A semiconductor device for storing data, according to claim 16, wherein said multiplicity is equal to said plurality.

18. A semiconductor device for storing data, according to claim 17, wherein each serial access memory of said multiplicity comprises:
 a latch for storing accessed data; and
 a pointer for enabling said data to be accessed from said latch in a predetermined order.

19. A semiconductor device for storing data, according to claim 17, wherein said multiplicity of serial access memories comprises a decoder for selecting a starting point for said data to be accessed from each of said serial access memories, and each serial access memory of said multiplicity comprises:
 a latch for storing accessed data; and
 a shift register for enabling said starting point of said data to be accessed from said latch.

20. A multiple serial port random access memory on a semiconductor wafer comprising:
 a. an array of memory cells for storing data, said array defined by a number of rows and a number of columns, said number of columns defined by a plurality of sets;
 b. a random access memory port for accessing data, said random access memory port selectively coupled with each cell of said array;
 c. a multiplicity of bidirectional serial access memory ports for accesssing data, said multiplicity equal to said plurality, said multiplicity of serial access memory ports comprising a decoder for selecting a starting point for said data to be accessed from each of said serial access memory ports, each serial access memory port of said multiplicity comprising:
  (1) a latch for storing accessed data; and
  (2) a shift register for enabling access from said starting point of said data to be accessed from said latch; and
 d. a switching system for selectively coupling each serial access memory port of said multiplicity with each set of said plurality, and each serial access memory port of said multiplicity with each other serial access memory port of said multiplicity, said switching system comrpising transfer and switching gates.

* * * * *